US011646238B2

(12) United States Patent
Chiang et al.

(10) Patent No.: US 11,646,238 B2
(45) Date of Patent: May 9, 2023

(54) DUAL CRYSTAL ORIENTATION FOR SEMICONDUCTOR DEVICES

(71) Applicant: Taiwan Semiconductor Manufacturing Co., Ltd., Hsinchu (TW)

(72) Inventors: Kuo-Cheng Chiang, Hsinchu County (TW); Chih-Hao Wang, Hsinchu County (TW); Ching-Wei Tsai, Hsinchu (TW); Kuan-Lun Cheng, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 266 days.

(21) Appl. No.: 17/174,942

(22) Filed: Feb. 12, 2021

(65) Prior Publication Data

US 2021/0193535 A1 Jun. 24, 2021

Related U.S. Application Data

(63) Continuation of application No. 16/426,660, filed on May 30, 2019, now Pat. No. 10,930,569.
(Continued)

(51) Int. Cl.
*H01L 21/82* (2006.01)
*H01L 21/84* (2006.01)
*H01L 21/8234* (2006.01)
*H01L 27/12* (2006.01)
*H01L 27/088* (2006.01)
*H01L 27/06* (2006.01)

(52) U.S. Cl.
CPC .... *H01L 21/845* (2013.01); *H01L 21/823412* (2013.01); *H01L 21/823431* (2013.01); *H01L 27/0623* (2013.01); *H01L 27/0886* (2013.01); *H01L 27/1207* (2013.01); *H01L 27/1211* (2013.01)

(58) Field of Classification Search
None
See application file for complete search history.

(56) References Cited

U.S. PATENT DOCUMENTS 9,299,721 B2 * 3/2016 Liu ............... H01L 27/0886
9,991,262 B1   6/2018 Ching et al.
(Continued)

*Primary Examiner* — Benjamin P Sandvik
(74) *Attorney, Agent, or Firm* — Sterne, Kessler, Goldstein & Fox P.L.L.C.

(57) ABSTRACT

The present disclosure relates to a semiconductor device and a manufacturing method, and more particularly to a semiconductor device with fin structures having different top surface crystal orientations and/or different materials. The present disclosure provides a semiconductor structure including n-type FinFET devices and p-type FinFET devices with different top surface crystal orientations and with fin structures having different materials. The present disclosure provides a method to fabricate a semiconductor structure including n-type FinFET devices and p-type FinFET devices with different top surface crystal orientations and different materials to achieve optimized electron transport and hole transport. The present disclosure also provides a diode structure and a bipolar junction transistor structure that includes SiGe in the fin structures.

20 Claims, 14 Drawing Sheets

Related U.S. Application Data

(60) Provisional application No. 62/712,766, filed on Jul. 31, 2018.

(56) References Cited

U.S. PATENT DOCUMENTS

| | | |
|---|---|---|
| 10,269,803 B2 | 4/2019 | Ching et al. |
| 2009/0159972 A1 | 6/2009 | Jakschik et al. |
| 2014/0145242 A1 | 5/2014 | Huang et al. |
| 2014/0335665 A1 | 11/2014 | Basu et al. |
| 2016/0379894 A1* | 12/2016 | Hashemi ............ H01L 21/30608 438/427 |
| 2017/0047331 A1 | 2/2017 | Chen et al. |
| 2018/0247929 A1 | 8/2018 | Shrivastava et al. |
| 2018/0301384 A1 | 10/2018 | Ching et al. |
| 2018/0331104 A1 | 11/2018 | Bi et al. |

* cited by examiner

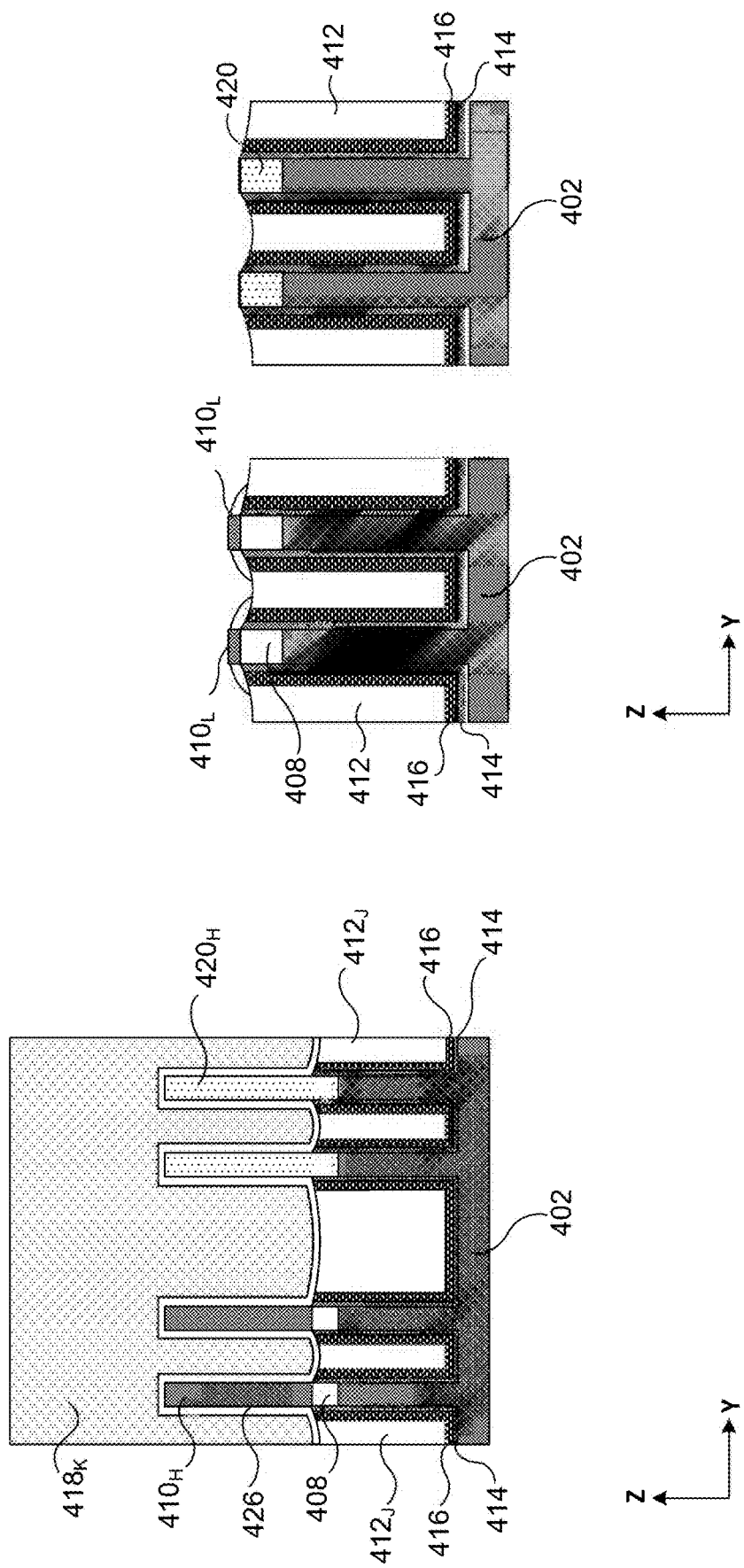

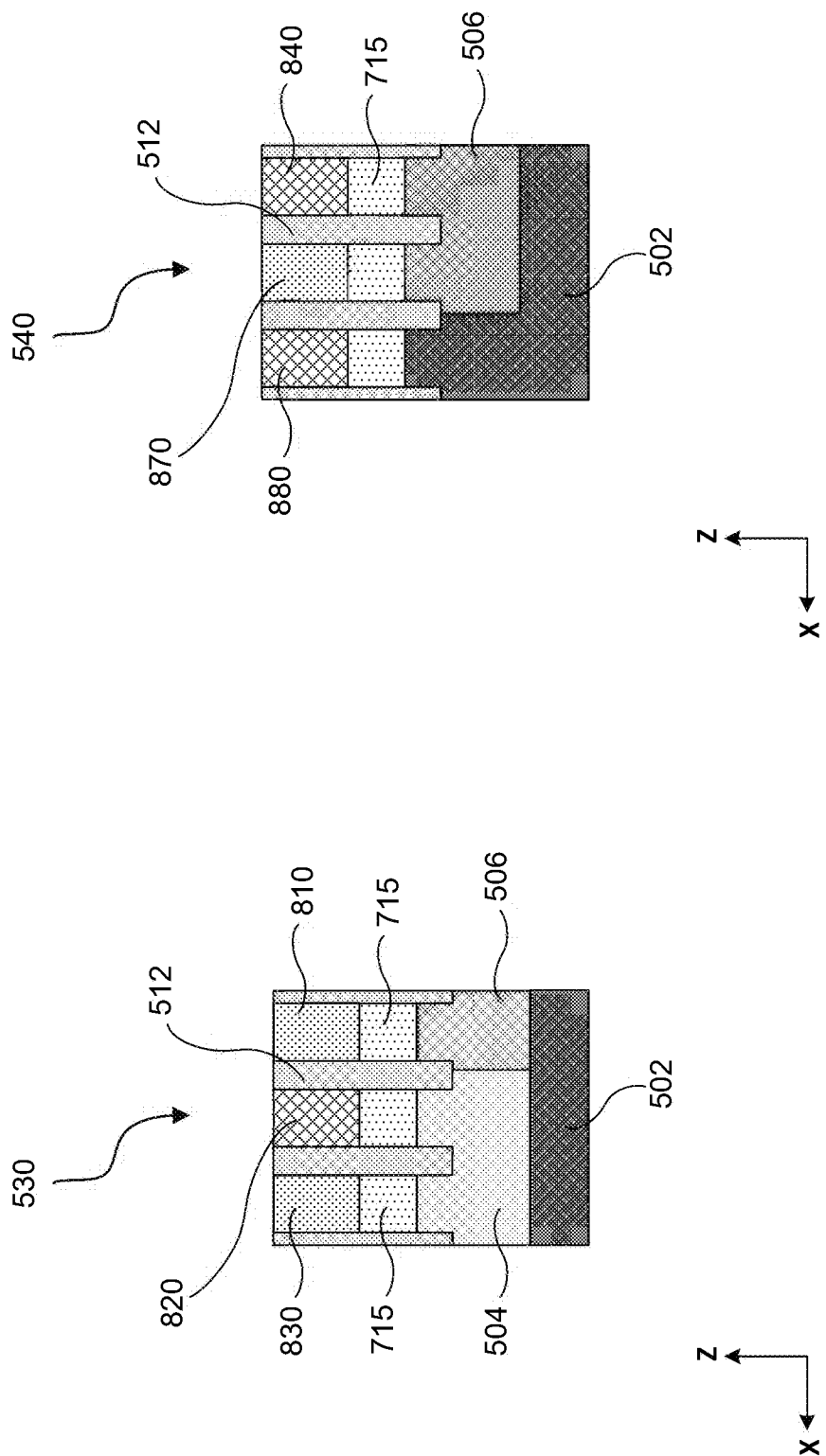

DUAL CRYSTAL ORIENTATION FOR SEMICONDUCTOR DEVICES

This application is a continuation of U.S. Non-provisional patent application Ser. No. 16/426,660, titled "Dual Crystal Orientation for Semiconductor Devices," which was filed on May 30, 2019, which claims the benefit of U.S. Provisional Patent Application No. 62/712,766, titled "Dual Crystal Orientation for Semiconductor Devices," which was filed on Jul. 31, 2018, all of which are incorporated herein by reference in their entireties.

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features can be arbitrarily increased or reduced for clarity of illustration and discussion.

FIGS. 4A-4M are a series of cross-sectional views of partially-fabricated semiconductor structures illustrating an exemplary fabrication process of forming the partially-fabricated semiconductor structure of n-type FinFETs and p-type FinFETs, in accordance with some embodiments.

FIGS. 8A and 8B are schematics of an NPN bipolar junction transistor and a PNP bipolar junction transistor, respectively, in accordance with some embodiments.

DETAILED DESCRIPTION

Figure 1:
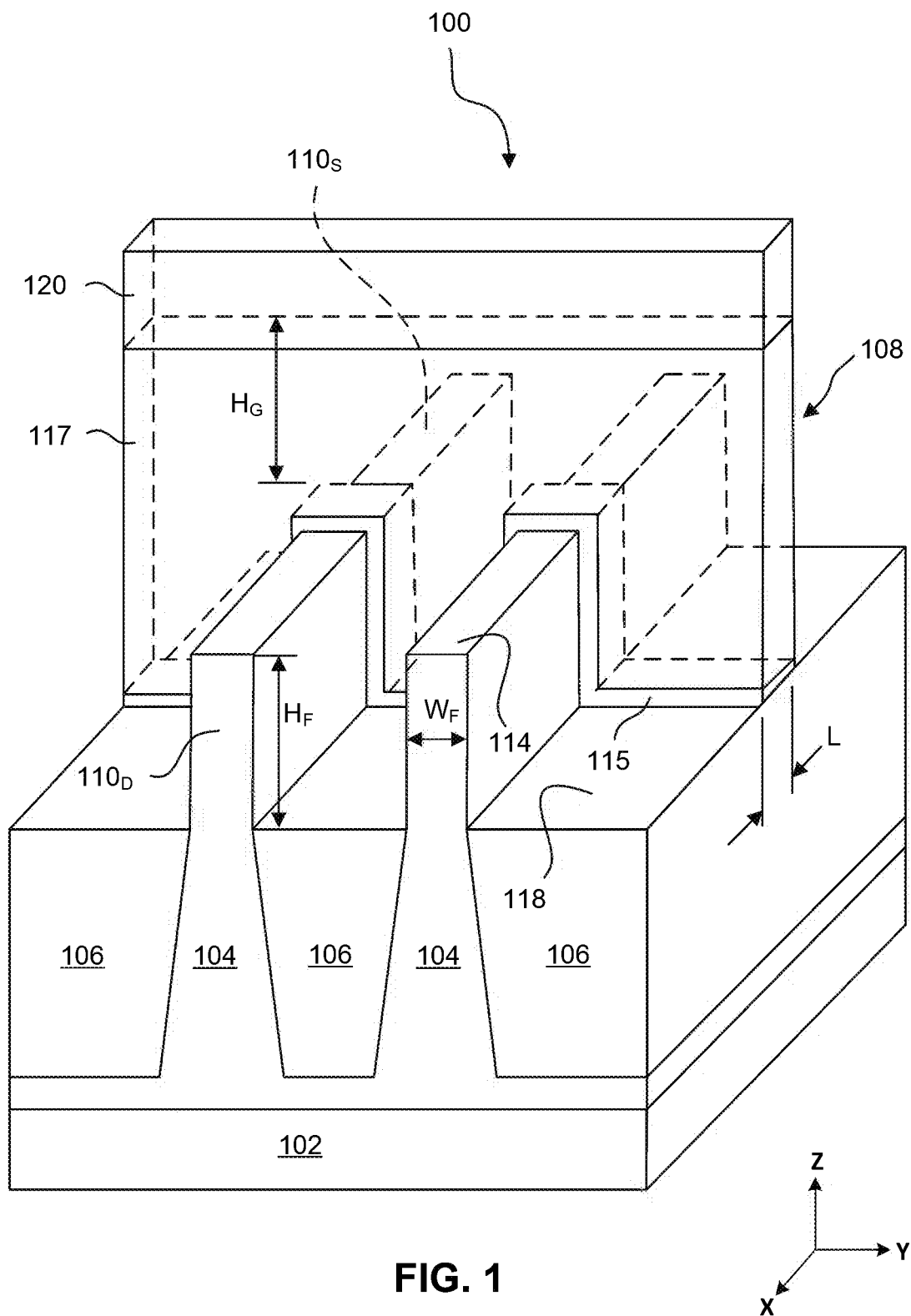
FIG. 1 is a cross-sectional view of a partially-fabricated semiconductor structure of FinFETs, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows can include embodiments in which the first and second features are formed in direct contact, and can also include embodiments in which additional features are disposed between the first and second features, such that the first and second features are not in direct contact. In addition, the present disclosure can repeat reference numerals and/or letters in the various examples. This repetition does not in itself dictate a relationship between the various embodiments and/or configurations discussed.

Further, spatially relative terms, such as "beneath," "below," "lower," "above," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

The acronym "FET," as used herein, refers to a field-effect transistor. An example of a FET is a metal oxide semiconductor field-effect transistor (MOSFET). MOSFETs can be, for example, (i) planar structures built in and on the planar surface of a substrate, such as a semiconductor wafer or (ii) built with vertical structures.

The term "FinFET" refers to a fin field-effect transistor, which is a FET that is formed over a fin and vertically oriented with respect to the planar surface of a wafer.

"S/D" refers to the source and/or drain junctions that form two terminals of a FET.

The term "vertical," as used herein, means nominally perpendicular to the surface of a substrate.

The expression "epitaxial layer" refers to a layer or structure of single crystal material. Likewise, the expression "epitaxially grown" refers to a layer or structure of single crystal material. Epitaxially-grown material can be doped or undoped.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "substantially" as used herein indicates the value of a given quantity that can vary based on a particular technology node associated with the subject semiconductor device. Based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. Based on the particular technology node, the term "about" can indicate a value of a given quantity that varies within, for example, 5-30% of the value (e.g., ±5%, ±10%, ±20%, or ±30% of the value).

Increasing performance of semiconductor devices on a substrate (e.g., integrated circuit (IC) transistors, resistors, capacitors, diodes, etc. on a semiconductor (e.g., silicon) substrate) is critical and challenging during design and manufacture of those devices. For example, during design and manufacture of, metal oxide semiconductor (MOS) transistor semiconductor devices, such as those used in a complementary metal oxide semiconductor (CMOS), it is often desired to increase performance by increasing the movement of electrons (e.g., charge carriers) in n-type MOS device (NMOS) channels and/or by increasing the movement of positive charged holes (e.g., charge carriers) in p-type MOS device (PMOS) channels. Increased charge carrier mobility can lead to increased drive current (such as at drive current saturation), which enhances device performance. One challenge is that electrons and holes can have different mobility values on the surface of semiconductor wafers (e.g., silicon wafer) having a particular crystal orientation. For example, electron transport is better on (100) wafer while hole transport is better on (110) surface. The different transport characteristics of electrons and holes can cause inferior and unbalanced performance when fabricating both n-type FinFETs and p-type FinFETs on the same substrate. To address this problem, this disclosure provides a device structure with dual substrate orientation with n-type FinFETs and p-type FinFETs having different crystal orientations. In addition, this disclosure provides a device structure with silicon germanium (SiGe) in the active layer to form a strained silicon device in order to increase mobility of charge carriers. In one aspect, this disclosure relates to FinFETs. A FinFET utilizes a vertical device structure. Channel regions of the FinFET are formed in the fins, and gate structures are disposed over sidewalls and top surfaces of the fins. Gate structures surrounding the channel provides the benefit of controlling the channel regions from three sides.

Various embodiments in accordance with this disclosure provide semiconductor device structures where the fin structures have different top surface crystal orientations and/or different materials to improve electron and/or hole mobility to optimize device performance. In some embodiments, the disclosure provides a semiconductor structure including n-type FinFET devices and p-type FinFET devices with different top surface crystal orientations of the fin structures. In some embodiments, the disclosure provides n-type FinFET devices including a first fin structure having a first top surface crystal orientation (110) and p-type FinFET devices including a second fin structure having a second top surface crystal orientation (100). In some embodiments, the disclosure provides n-type FinFET devices including a first fin structure having a first top surface crystal orientation (100) rotated 45-degree and p-type FinFET devices including a second fin structure having a second top surface crystal orientation (100). In some embodiments, the disclosure provides a semiconductor structure including n-type FinFET devices and p-type FinFET devices with different materials of the fin structures. In some embodiments, the disclosure provides n-type FinFET devices including a first fin structure having a first material, such as silicon, and p-type FinFET devices including a second fin structure having a second material, such as SiGe. In some embodiments, the disclosure provides a diode structure including SiGe in the fin structure. In some embodiments, the disclosure provides a bipolar junction transistor structure including SiGe in the fin structure.

In accordance with various embodiments of this disclosure, using a semiconductor device structure with different crystal orientations and/or different materials for fin structures for p-type FinFET devices and n-type FinFET devices provides, among other things, benefits of (i) enhanced electron mobility; (ii) enhanced hole mobility; (iii) improved drive current; (iv) optimized device performance; and (v) providing a streamlined, simple, and cost effective process to fabricate n-type FinFET devices, p-type FinFET devices, and suitable other semiconductor devices such as bipolar junction transistor structures and diodes on the same substrate with optimized drive current for the FinFET devices.

Before describing the embodiments of the present disclosure, an exemplary structure for a FinFET is presented. FIG. 1 provides an isometric view of a semiconductor device that includes partially-fabricated FinFETs, in accordance with some embodiments.

FIG. 1 is an isometric view of a semiconductor structure 100, in accordance with some embodiment of the present disclosure. Semiconductor structure 100 includes FinFET s. Specifically, semiconductor structure 100 includes a substrate 102, a plurality of fins 104, a plurality of isolation structures 106, and a gate structure 108. Gate structure 108 is disposed over sidewalls and a top surface of each of fins 104. Fins 104 and isolation structures 106 have top surfaces 114 and 118, respectively. Gate structure 108 includes a gate dielectric layer 115 and a gate electrode structure 117. In some embodiments, one or more additional layers or structures can be included in gate structure 108.

FIG. 1 shows a hard mask 120 disposed on a top surface of gate electrode structure 117. Hard mask 120 is used to pattern, such as by etching, gate structure 108. In some embodiments, hard mask 120 includes a dielectric material, such as silicon nitride. The isometric view of FIG. 1 is taken after the patterning process (e.g., etching) of a gate dielectric layer and a gate electrode layer to form gate structure 108. Integrated circuits can include a plurality of such, and similar, gate structures.

Each of the plurality of fins 104 includes a pair of source/drain (S/D) terminals, where a source terminal is referred to as source region 110s and a drain terminal is referred to as drain region 110. The source and drain regions 110s and 110D are interchangeable and are formed in, on, and/or surrounding fins 104. A channel region of fins 104 underlies gate structure 108. Gate structure 108 has a gate length L and a gate width $(2 \times H_F + W_F)$, as shown in FIG. 1. In some embodiments, the gate length L is in a range from about 10 nm to about 30 nm. In some embodiments, the gate length L is in a range from about 3 nm to about 10 nm. In some embodiments, the fin width $W_F$ is in a range from about 6 nm to about 12 nm. In some embodiments, the fin width $W_F$ is in a range from about 4 nm to about 6 nm. Gate height HG of gate structure 108, measured from a fin top surface 114 to the top of gate structure 108, is in a range from about 50 nm to about 80 nm, in some embodiments. Fin height $H_F$ of fin 104, measured from the isolation structure top surface 118 to fin top surface 114, is in a range from about 5 nm to about 100 nm, in some embodiments.

Substrate 102 can be a silicon substrate, according to some embodiments. In some embodiments, substrate 102 can be (i) another semiconductor, such as germanium; (ii) a compound semiconductor including silicon carbide, gallium arsenide, gallium phosphide, indium phosphide, indium arsenide, gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), and/or indium antimonide; (iii) an alloy semiconductor including SiGe; or (iv) combinations thereof. In some embodiments, substrate 102 can be a silicon on insulator (SOI). In some embodiments, substrate 102 can be an epitaxial material.

Fins 104 are active regions where one or more transistors are formed. Fins 104 can include: (i) silicon (Si) or another elementary semiconductor, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP and/or indium antimonide; (iii) an alloy semiconductor including SiGe; or (iv) combinations thereof. Fins 104 can be fabricated using suitable processes, including patterning and etch processes. The patterning process can include forming a photoresist layer overlying the substrate (e.g., on a silicon layer), exposing the resist to a pattern, performing post-exposure bake processes, and developing the resist to form a masking element including the resist. The masking element can then be used to protect regions of the substrate while an etch process forms recesses into substrate 102, leaving protruding fins. The recesses can be etched using a reactive ion etch (RIE) and/or other suitable processes. Numerous other methods to form fins 104 on substrate 102 can be suitable. For example, fins 104 can include epitaxial material, in accordance with some embodiments.

Isolation structures 106 can partially fill the recesses and can include a dielectric material such as, for example, silicon oxide, spin-on-glass, silicon nitride, silicon oxynitride, fluorine-doped silicate glass (FSG), a low-k dielectric material, other suitable insulating material, and/or combinations thereof. In some embodiments, isolation structures 106 can be shallow trench isolation (STI) structures and can be formed by etching trenches in substrate 102. The trenches can be filled with insulating material, followed by a chemical-mechanical polishing (CMP) and etch-back process. Other fabrication techniques for isolation structures 106 and/or fins 104 are possible. Isolation structures 106 can include a multi-layer structure such as, for example, a structure with one or more liner layers. Isolation structures 106 can also be formed by depositing an enhanced gap fill layer using the multi-step deposition and treatment process to eliminate voids and seams in the gap fill material.

Gate structure 108 can include a gate dielectric layer 115, a gate electrode structure 117, and/or one or more additional layers, according to some embodiments. In some embodiments, gate structure 108 uses polysilicon as gate electrode structure 117. Also shown in FIG. 1 is a hard mask 120 disposed on a top surface of gate electrode structure 117. Hard mask 120 is used to pattern, such as by etching, gate structure 108. In some embodiments, hard mask 120 includes a dielectric material, such as silicon nitride.

Although gate structure 108 is described as using polysilicon or amorphous silicon for gate electrode structure 117, gate structure 108 can be a sacrificial gate structure, such as a gate structure formed in a replacement gate process for a metal gate structure. The replacement gate process and associated manufacturing steps can be performed and are not shown in these figures. The metal gate structure can include barrier layer(s), gate dielectric layer(s), work function layer(s), fill metal layer(s), and/or other suitable materials for a metal gate structure. In some embodiments, the metal gate structure can include capping layers, etch stop layers, and/or other suitable materials.

Exemplary p-type work function metals that can be included in the metal gate structure are TiN, tantalum nitride (TaN), ruthenium (Ru), molybdenum (Mo), aluminum (Al), tungsten nitride (WN), zirconium disilicide ($ZrSi_2$), molybdenum disilicide ($MoSi_2$), tantalum disilicide ($TaSi_2$), nickel disilicide ($NiSi_2$), platinum (Pt), other suitable p-type work function materials, or combinations thereof. Exemplary n-type work function metals that can be included in the metal gate structure are Al, titanium (Ti), silver (Ag), tantalum aluminum (TaAl), tantalum aluminum carbon (TaAlC), tantalum aluminum nitride (TiAlN), tantalum carbide (TaC), tantalum carbide nitride (TaCN), tantalum silicide nitride (TaSiN), manganese (Mn), zirconium (Zr), other suitable n-type work function materials, or combinations thereof. A work function is associated with the material composition of the work function layer. Thus, the material of a work function layer can be chosen to tune its work function so that a desired threshold voltage Vth is achieved by a device formed in the respective region. The work function layer(s) can be deposited by chemical vapor deposition (CVD), plasma-enhanced CVD (PECVD), atomic layer deposition (ALD), other suitable processes, and/or combinations thereof.

A fill metal layer can be deposited over the work function metal layer(s). The fill metal layer fills in remaining portions of trenches or openings formed by removal of the sacrificial gate structure. The fill metal layer can include Al, W, copper (Cu), and/or other suitable materials. The fill metal can be formed by ALD, CVD, physical vapor deposition (PVD), plating, other suitable processes, and/or combinations thereof.

Semiconductor device structure 100 described above includes fins 104 and gate structure 108. The semiconductor device structure 100 can include multiple gate structures 108 formed over fins 104. The semiconductor device structure 100 can include additional processing to form various features such as, for example, lightly-doped-drain (LDD) regions and doped S/D structures. The term "LDD region" is used to describe lightly-doped regions disposed between a channel region of a transistor and at least one of the transistor's S/D regions. LDD regions can be formed in fins 104 by doping. Ion implantation can be used, for example, for the doping process. Other processes can be used for doping the LDD regions.

Figure 2:
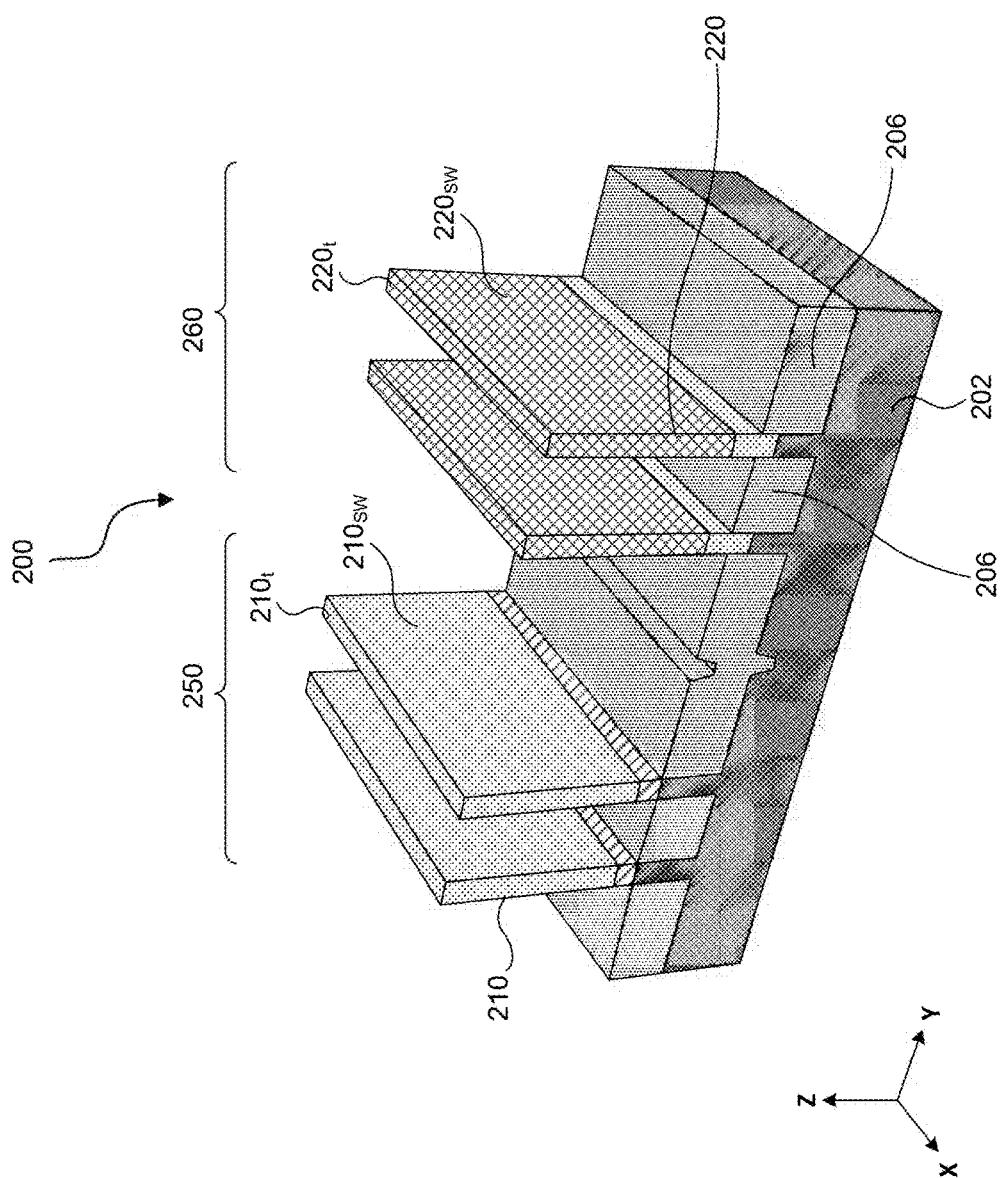
FIG. 2 is an isometric view of a partially-fabricated semiconductor structure of n-type FinFETs and p-type FinFETs, in accordance with some embodiments.
Figure 3:
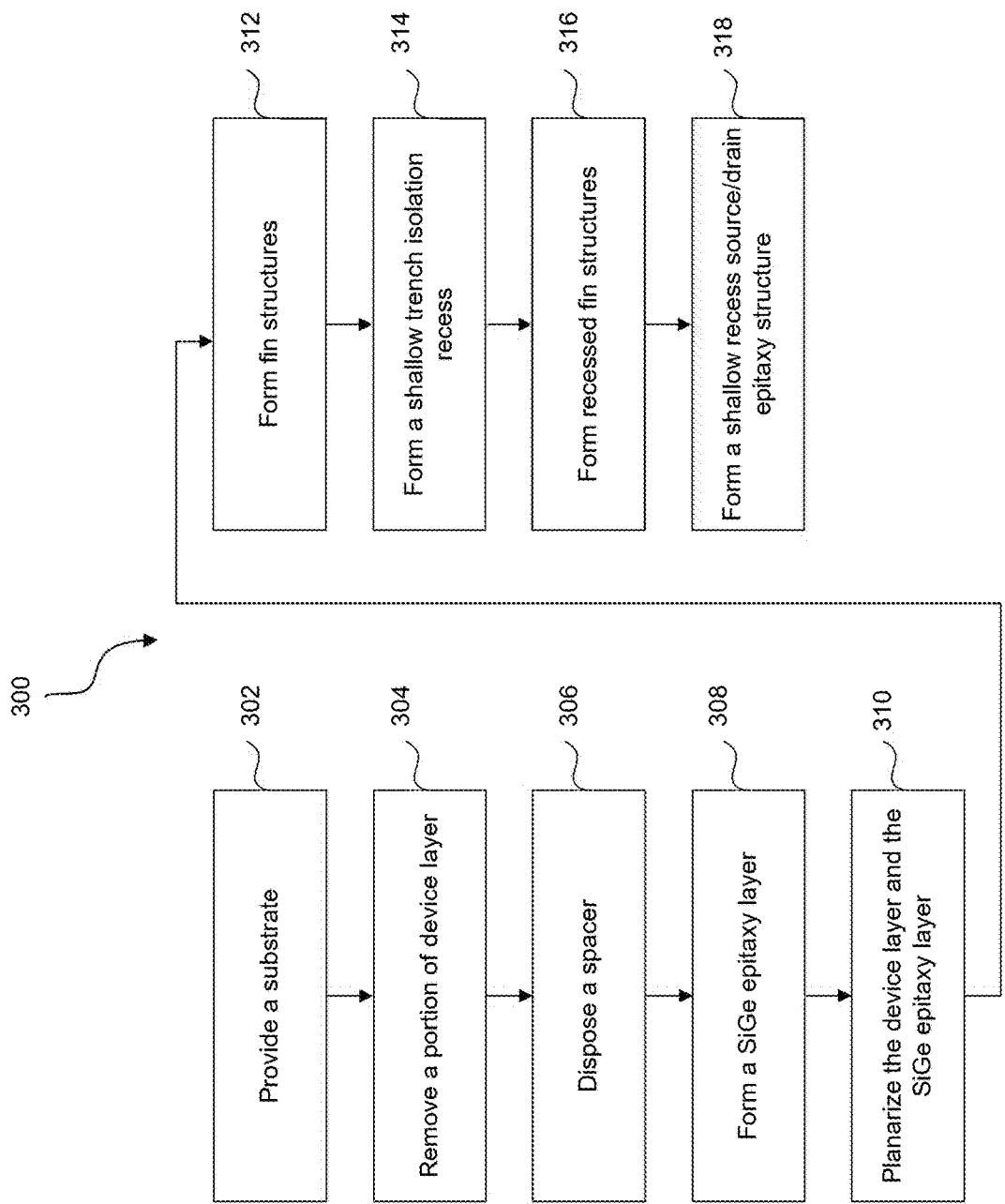
FIG. 3 is a flowchart of an exemplary method of forming a partially-fabricated semiconductor structure of n-type FinFETs and p-type FinFETs, in accordance with some embodiments.

FIGS. 2, 3, 5, 6, 7A-7B, and 8A-8B illustrate various semiconductor devices according to different embodiments in this disclosure. FIG. 3 is a flow chart of an example fabrication process of a semiconductor device that includes both n-type FinFET and p-type FinFET. FIGS. 4A-4M illustrate an example fabrication process of a semiconductor device that includes both n-type FinFET and p-type FinFET, showing cross sectional views of the semiconductor device structure during various stages of fabrication. The fabrication process provided herein is exemplary, and additional operations can be performed. These additional operations are not shown in the figures for simplicity.

FIG. 2 is a 3D view of an exemplary partially-fabricated semiconductor structure 200 including partially-fabricated n-type FinFET devices 250 and partially-fabricated p-type FinFET devices 260, after a plurality of first fin structures 210 and second fin structures 220 formed on substrate 202, in accordance with some embodiments.

Substrate 202 can include silicon or some other suitable elementary semiconductor such as, for example, diamond or germanium (Ge); a suitable compound semiconductor such as, for example, silicon carbide (SiC), indium arsenide (InAs), or indium phosphide (InP); or a suitable alloy semiconductor such as, for example, silicon germanium carbide (SiGeC), gallium arsenic phosphide (GaAsP), gallium indium phosphide (GaInP), or silicon on insulator (SOI). In some embodiments, substrate 202 can be a silicon wafer. In some embodiments, substrate 202 can be a silicon on insulator (SOI) wafer.

Silicon wafers can be grown from crystal having a regular crystal structure, with silicon having a diamond cubic structure with an example lattice spacing of about 5.4 Å (about 0.54 nm). In one process for forming the silicon wafer, a cylindrical ingot of high purity mono crystalline silicon, is sliced with a wafer saw and polished to form wafers. During the slicing process, the surface is aligned in one of several relative directions known as crystal orientations. Orientation is defined by the Miller index with (100) or (111) faces being example orientations for silicon. Orientation is important since many of a single crystal's structural and electronic properties are highly anisotropic. For example, electron mobility is higher on the (100) plane than on the (110) plane since each direction offers distinct paths for charge transport. Ion implantation depths also depend on the wafer's crystal orientation, since each direction offers distinct paths for ion transport. In some embodiments, substrate 202 can include silicon having a (100) top surface crystal orientation.

In some embodiments, first fin structures 210 and second fin structures 220 protrude from substrate 202, as illustrated by FIG. 2. In some embodiments, first fin structures 210 and second fin structures 220 are parallel and extend in one direction (e.g., z-direction). Although four fin structures are illustrated in FIG. 2, fewer or more fin structures can be included in semiconductor structure 200. First fin structures 210 and second fin structures 220 can include silicon or some other suitable elementary semiconductor materials such as, for example, diamond or germanium (Ge); a suitable compound semiconductor such as, for example, silicon carbide (SiC), indium arsenide (InAs), or indium phosphide (InP); or a suitable alloy semiconductor such as, for example, silicon germanium carbide (SiGeC), gallium arsenic phosphide (GaAsP), or gallium indium phosphide (GaInP). In some embodiments, first fin structures 210 can include a first material including, but not limited to, silicon. In some embodiments, second fin structures 220 can include a second material including, but not limited to, SiGe. In some embodiments, first fin structures 210 can be doped with n-type dopants such as, for example, phosphorus (P) and arsenide (As). In some embodiments, second fin structures 220 can be doped with p-type dopants such as, for example, boron (B) and gallium (Ga). In some embodiments, the first fin structures can be doped with n-type dopants and serve as n-type FinFETs (e.g., NMOS devices), while the second fin structures can be doped with p-type dopants and serve p-type FinFETs (e.g., PMOS devices).

In some embodiments, first fin structures 210 can include silicon having (110) or (100) rotated 45-degree ((100) R45) crystal orientation. In some embodiments, second fin structures 220 can include SiGe having (100) crystal orientation. The fin structures can include a top surface and sidewalls having different crystal orientations. For example, when a silicon substrate is grown to have a fin top surface ($210_t$) crystal orientation (110) or (100) rotated 45-degree ((100) R45), an index system for a crystal plane in an active layout for forming the fin is set such that the sidewalls ($210_{sw}$) of the first fin structures have a (100) sidewalls crystal orientation. And in this case, first fin structures 210 is referred to as having (110) top surface crystal orientation or (100) rotated 45-degree ((100) R45) top surface crystal orientation. Similarly, when a silicon substrate is grown to have a fin top surface ($220_t$) crystal orientation (100), an index system for a crystal plane in an active layout for forming the second fin structure is set such that the sidewalls of the second fin structures have a (110) sidewalls crystal orientation. And in this case, the second fin structure is referred to as having (100) top surface crystal orientation. In some embodiments, the sidewalls of the fin structures carry a significant portion of the S/D current (as compared to the top surfaces of the fin structures), and electron mobility is higher on the (100) plane and the hole mobility is higher on the (110) plane. Therefore, by selectively choosing the dual crystal orientation for the first and the second fin structures, electron transport of the first fin structures (e.g., n-type FinFET) and hole transport of the second fin structures (e.g., p-type FinFET) can be optimized.

In some embodiments, first fin structures 210 and second fin structures 220 are formed by patterning a hard mask layer and etching into substrate 202 using an anisotropic etch (e.g., dry etch). In some embodiments, the anisotropic etch uses chlorine and/or fluorine-based chemicals. The areas covered by hard mask layer are blocked by the hard mask layer during the anisotropic etch process, and the areas not covered by hard mask layer are recessed, resulting in first fin structures 210 and second fin structures 220.

In some embodiments, semiconductor device 200 can include isolation structures 206 formed over substrate 202 and on opposing sidewalls of first fin structures 210 and second fin structures 220. In some embodiments, isolation structures 206 can fill the openings between first fin structures 210 and second fin structures 220 and provide isolation between the adjacent fins. Isolation structures 206 can include a dielectric material such as, for example, silicon oxide, spin-on-glass, silicon nitride, silicon oxynitride, FSG, a low-k dielectric material, other suitable insulating material, and/or combinations thereof. In some embodiments, isolation structures 206 can be shallow trench isolation (STI) structures and can be formed by depositing insulating material to fill the openings and followed by a CMP and an etch-back process. Isolation structures 206 can include a multi-layer structure such as, for example, a structure with one or more liner layers. Isolation structures 206 can also be formed by depositing an enhanced gap fill layer using the multi-step deposition and treatment process to eliminate voids and seams in the gap fill material. Isolation structures 206 can be formed by an etch back process by removing the hard mask layer and etching back a portion of the deposited material to form isolation structures 206. In some embodiments, removing the hard mask layer includes performing a wet chemical process with phosphoric acid ($H_3PO_4$) that etches silicon nitride. In some embodiments, the hard mask layer can be removed using a CMP process.

After the hard mask layer is removed, isolation structures 206 can be etched back to expose a portion of first fin structures 210 and second fin structures 220. In some embodiments, isolation structures 206 are etched back so that the top surface of the remaining isolation structures is below the top surface of the first fin structures 210 and second fin structures 220. The etch processes in isolation structures 206 can be plasma processes, for example, a reactive ion etching (RIE) process using oxygen-based plasma. In some embodiments, the RIE etching process can include other etchant gas such as, for example, nitrogen, carbon tetrafluoride ($CF_4$), and/or other suitable gases. Numerous other methods to etch back the isolation structure can be suitable. In some embodiments, the height of the first fin structures 210 and second fin structures 220 measured from the top surface of the remaining isolation structures 206 to the top surface of first fin structures 210 and second fin structures 220 is between about 50 nm and about 90 nm (e.g., between 65 nm and 70 nm). After isolation structures 206 are etched back, portions of first fin structures 210 and second fin structures 220 can protrude from the remaining portions of isolation structures 206. In some embodiments, a gate structure (not shown) can be formed over the first and second fin structures. In some embodiments, semiconductor structure 200 can include one or more n-type FinFET devices and one or more p-type FinFET devices.

FIG. 3 is a flowchart of an exemplary method 300 of forming a semiconductor device, according to some embodiments of the present disclosure. Operations can be performed in a different order or not performed depending on specific applications. Method 300 is described with reference to fabrication processes and structures illustrated in FIGS. 4A-4M. It should be noted that method 300 does not produce a complete semiconductor structure 100 as shown in FIG. 1. Accordingly, it is understood that additional processes can be provided before, during, and after method 300.

Referring to FIG. 3, method 300 starts at operation 302, in which a substrate is provided. As illustrated in FIG. 4A, substrate 401 can be a silicon-on-insulator wafer having a device layer $410_A$ separated from a Si substrate 402 by a buried oxide (BOX) layer $408_A$. In some embodiments, buried oxide layer can have a thickness between about 5 nm and about 15 nm.

In some embodiments, Si substrate 402 can have top surface crystal orientation (100). In some embodiments, device layer $410_A$ can have top surface crystal orientation (110) or (100) R45. Substrate 401 can be formed by various wafer bonding techniques. During the wafer bonding process, a donor wafer (e.g., device layer $410_A$) can be bonded to a handle wafer (e.g., Si substrate 402) each having a different top surface crystal orientation. Prior to bonding, both wafers can be prepared with a pretreatment process including cleaning, plasma surface activation, growth of bonding layer or a combination thereof, to facilitate high strength-void free bonding. In some embodiments, the plasma surface activation can be achieved by hydrophobic, hydrophilic, direct surface states, or other processes. In some embodiments, the substrates can be cleaned with HF prior to bonding. Following the bonding, a high temperature anneal can be used to strengthen the bond interface (e.g., between $410_A$ and 402). In some embodiments, the high temperature anneal can be carried out at temperatures ranging from 300° C. to 1100° C. In some embodiments, the bonded substrates can be annealed at about 600° C. In some embodiments, oxide layers (e.g., buried oxide (BOX) layer $408_A$) can be formed on one or both surfaces of the donor wafer and handle wafer. Examples of materials, which can be used for oxide layers, include but are not limited to, silicon dioxide ($SiO_2$), silicon nitride ($Si_3N_4$), plasma oxide and chemical oxide, or high-dielectric constant based oxides, such as hafnium oxide. Oxide layer formation can be performed by a variety of processes, including, but not limited to, ambient native growth, chemical growth, chemical vapor deposition (CVD), RF sputtering, atomic layer deposition (ALD), low pressure CVD, plasma-enhanced CVD or any other suitable process.

Figure 4B:
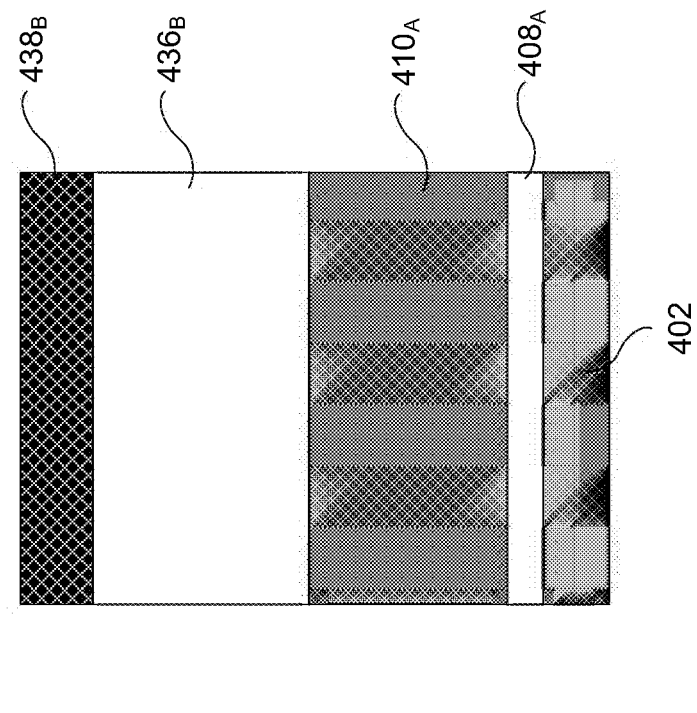
Figure 4A:
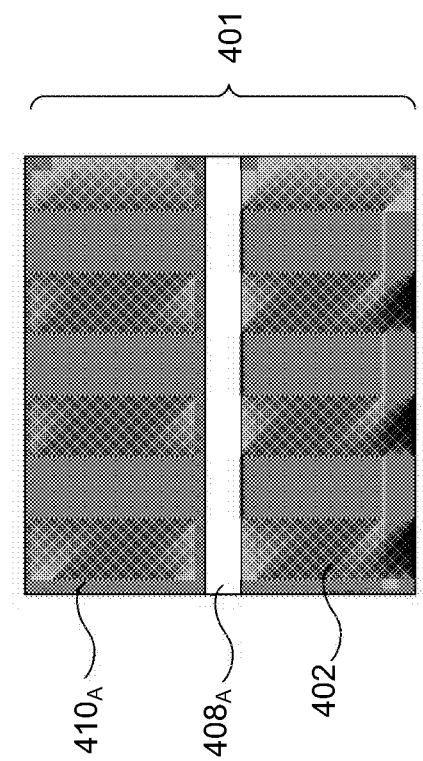

Subsequently, as shown in FIG. 4B, a bi-layer hard mask including oxide hard mask $436_B$ and nitride hard mask $438_B$ can be disposed on device layer $410_A$. In some embodiments, the thickness of the oxide hard mask $436_B$ is between about 40 nm and about 80 nm (e.g., between 40 nm and 80 nm), and the thickness of the nitride hard mask $438_B$ is between about 10 nm and about 30 nm (e.g., between 10 nm and 30 nm). In some embodiments, oxide hard mask $436_B$ includes $SiO_x$, and nitride hard mask $438_B$ includes silicon nitride ($SiN_x$) or silicon carbon nitride (SiCN). In some embodiments, the oxide hard mask $436_B$ can be a thin film including silicon oxide formed, for example, using a thermal oxidation process. In some embodiments, nitride hard mask $438_B$ can include silicon nitride formed by, for example, low pressure chemical vapor deposition (LPCVD) or plasma enhanced CVD (PECVD).

Figure 4D:
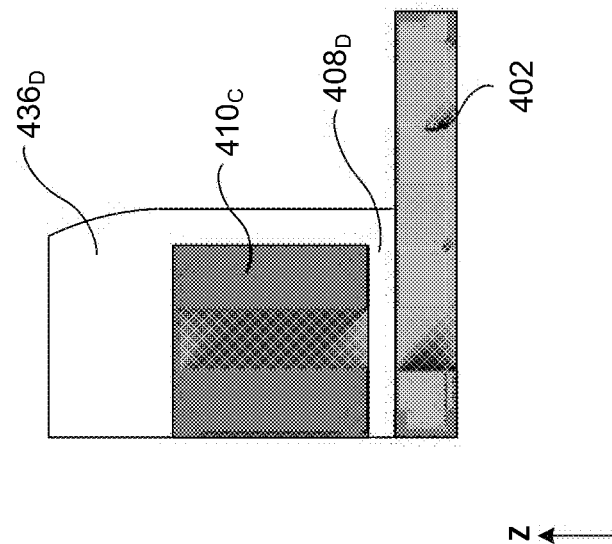
Figure 4C:
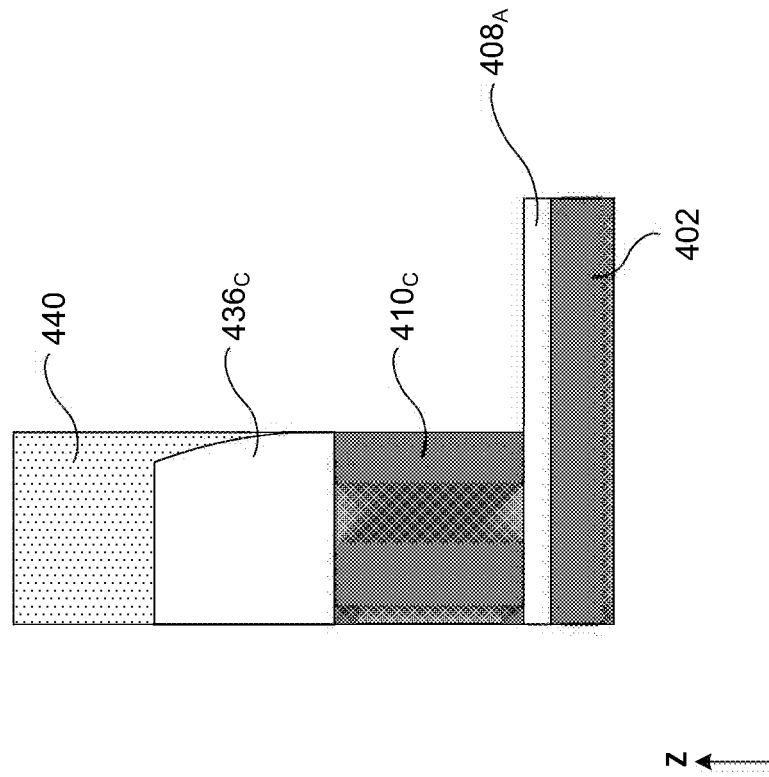

Referring to FIG. 3, method 300 proceeds to operation 304, in which a portion of device layer is removed. As illustrated in FIG. 4C, a portion of device layer $410_A$ (as shown in FIG. 4B) is removed to form openings at selected locations. And patterned device layer 410c can define a region for further n-type finFET device fabrication. Openings can be formed at selected locations by removing oxide hard mask $436_B$ and nitride hard mask $438_B$ and etching back a portion of device layer $410_A$. In some embodiments, the etching stops on buried oxide (BOX) layer $408_A$. In some embodiments, the removal of oxide hard mask $436_B$ and nitride hard mask $438_B$ can be performed using a dry etching process (e.g., reaction ion etching) or a wet etching process. In some embodiments, the removal of nitride hard mask $438_B$ can include performing a wet chemical process with $H_3PO_4$ that etches silicon nitride. In some embodiments, an exemplary fabrication process can include forming photoresist layer 440 overlying the semiconductor structure, exposing the photoresist to a mask having a pattern thereon, performing a post-exposure bake process, and developing the resist to form a masking layer over oxide hard mask 436c.

Referring to FIG. 3, method 300 proceeds to operation 306, in which a spacer is disposed over the device layer. As illustrated in FIG. 4D, spacer $436_D$ is formed on top and side surfaces of device layer $410_C$. Spacer $436_D$ can be a low-k spacer with a dielectric constant less than 3.9. In some embodiments, spacer $436_D$ can include elements, such as silicon (Si), oxygen (O), carbon (C), or combinations thereof. In some embodiments, the thickness of spacer $436_D$ is between about 6 nm and about 8 nm. In some embodiments, forming spacer $436_D$ includes a blanket deposition of a spacer layer followed by pulling back the spacer layer with an etch (e.g., a dry etch) process. In some embodiments, pulling back the spacer layer includes etching and removing the spacer layer and a portion of buried oxide layer $408_A$ to expose a portion of Si substrate 402.

Figure 4F:
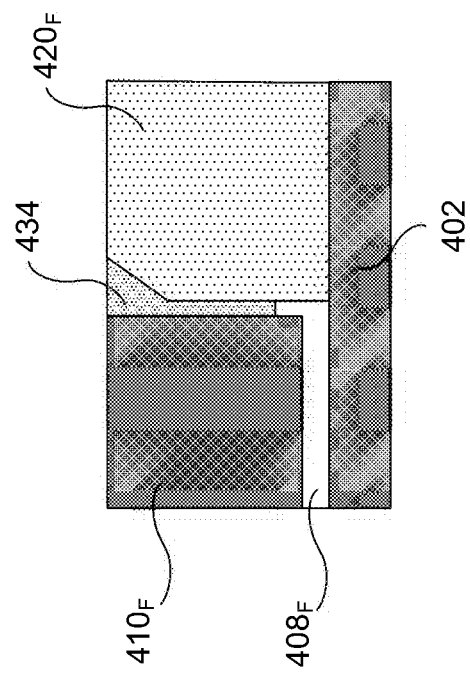
Figure 4E:
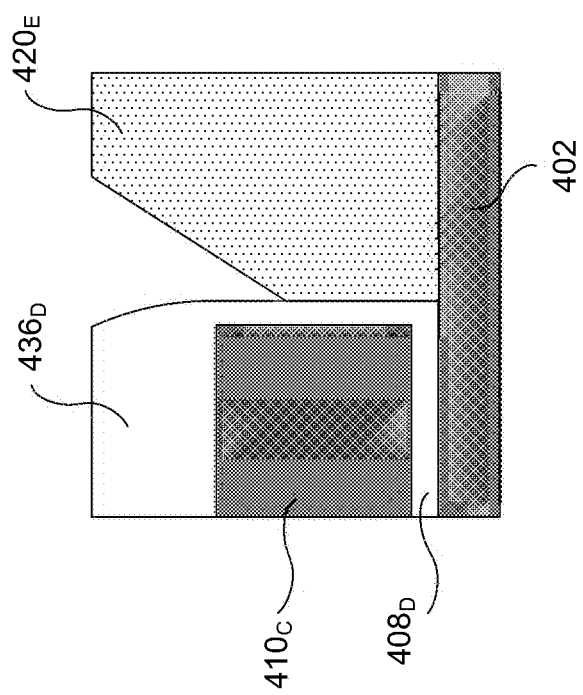

Referring to FIG. 3, method 300 proceeds to operation 308, in which a SiGe epitaxy layer is formed. As illustrated in FIG. 4E, SiGe epitaxy layer ($420_E$) is formed over a portion of substrate 402, where the device layer on the portion of substrate 402 is removed. In some embodiments, the SiGe epitaxy layer is formed at a temperature between about 400° C. and about 500° C. The epitaxy layer forming process can be a selective process that grows the epitaxy layer on the exposed surfaces of the silicon substrate. The growth process continues until a nominal size and/or structure of epitaxial SiGe has been reached.

Referring to FIG. 3, method 300 proceeds to operation 310, in which the device layer and the SiGe epitaxy layer are planarized. As illustrated in FIG. 4F, a planarization process (e.g., a CMP process) is performed to planarize the top surfaces of the semiconductor structure to form planarized device layer $410_F$ and SiGe epitaxy layer $420_F$. In some embodiments, after SiGe epitaxy layer formation and prior to CMP planarization, oxide hard mask and spacer can be removed by wet etch. In some embodiments, a preliminary planarization of the structure can be performed, including depositing a tri-layer of polysilicon, silicon nitride, and polysilicon 434 over the device layer and SiGe epitaxy layer, applying a CMP planarization process which stops on the middle silicon nitride layer, and performing a dry etch process to further etch back the semiconductor structure until the epitaxial SiGe is exposed.

Figure 4G:
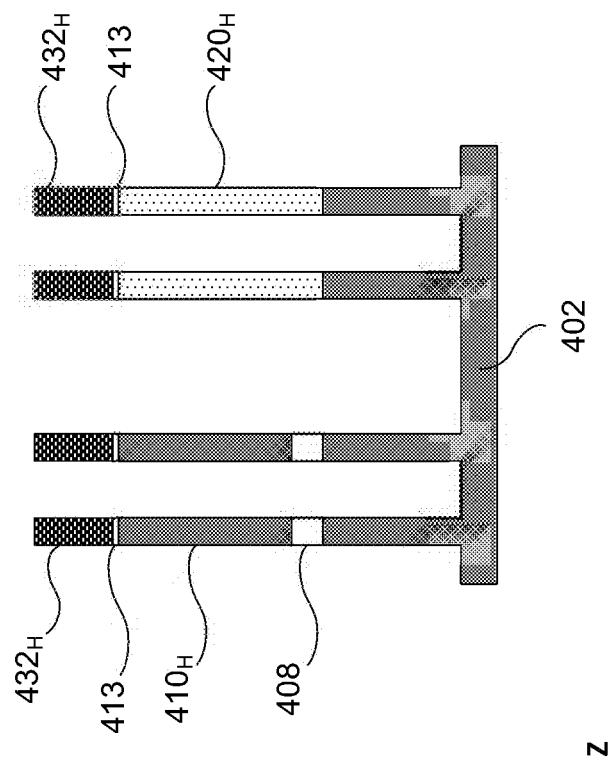
Figure 4H:
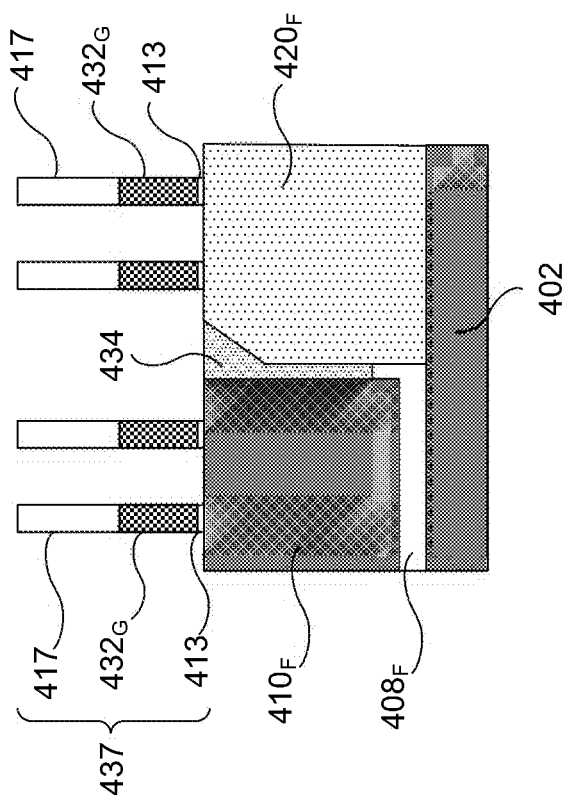

Referring to FIG. 3, method 300 proceeds to operation 312, in which the device layer and SiGe epitaxy layer are etched to form a plurality of fin structures. As illustrated in FIG. 4G and FIG. 4H, the formation of fin structures can include (i) forming and patterning a hard mask layer on device layer $410_F$ and SiGe epitaxy layer $420_F$ to form a patterned hard mask layer 437, and (ii) etching device layer $410_F$, SiGe epitaxy layer $420_F$ and Si substrate 402 through patterned hard mask layer 437. Patterned hard mask layer 437 can include thin oxide layer 413, nitride hard mask 432G and oxide hard mask layer 417. The etching can be performed using, for example, a dry etch process, a wet etch process, or a combination thereof. The dry etch process can use reactive ion etching using a chlorine or fluorine-based etchant. In some embodiments, the hard mask layer can be a thin film including silicon oxide formed, for example, using a thermal oxidation process. In some embodiments, hard mask layer can include silicon nitride formed by, for example, low pressure chemical vapor deposition (LPCVD) or plasma enhanced CVD (PECVD).

Figure 4J:
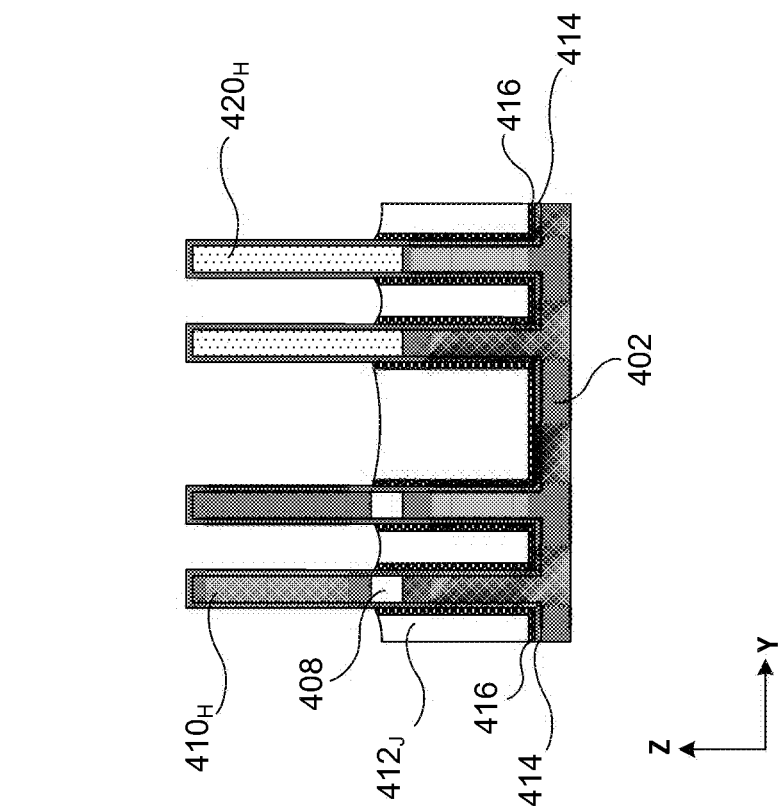
Figure 4I:
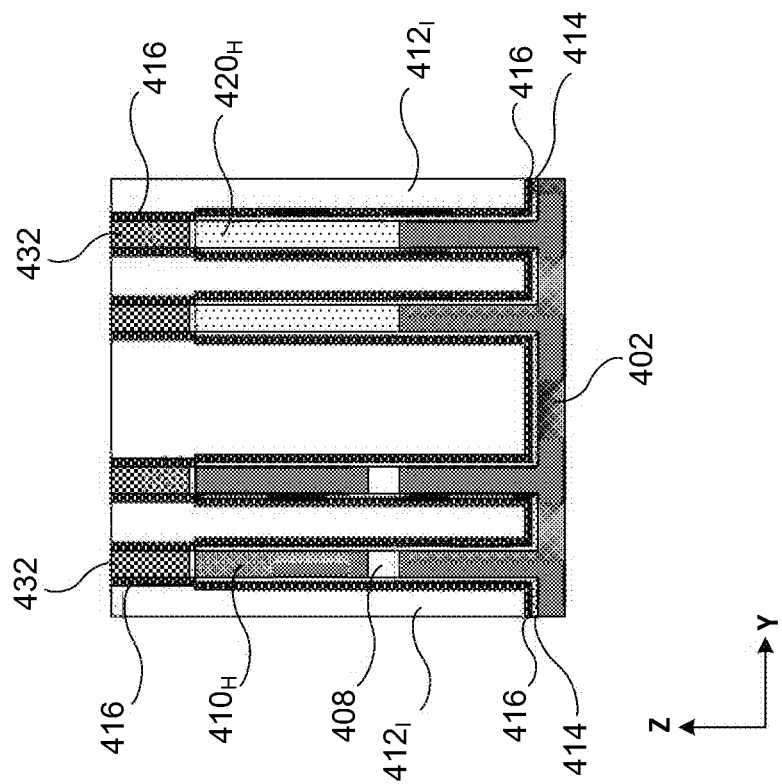

Referring to FIG. 3, method 300 proceeds to operation 314, in which an STI recess is formed between the fin structures. As illustrated in FIG. 4I and FIG. 4J, the formation of STI recess $412_J$ can include (i) depositing protective layer including Si liner 414 and SiN liner 416 on the structure of FIG. 4H; (ii) depositing a layer of insulating material in STI region $412_I$ on the protective layer; (iii) annealing the layer of insulating material; (iv) chemical mechanical polishing (CMP) the annealed layer of insulating material; and (v) etching the polished structure to form STI recess $412_J$. The protective layer including Si liner 414 and SiN liner 416 can be deposited using, for example, ALD or CVD. The protective layer can help to prevent oxidation of fin structures during the annealing process of the layer of insulating material.

In some embodiments, the layer of insulating material can include, for example, silicon oxide, silicon nitride, silicon oxynitride, fluoride-doped silicate glass (FSG), or a low-k dielectric material. In some embodiments, deposition of the layer of insulating material can be performed using any deposition methods suitable for flowable dielectric materials (e.g., flowable silicon oxide). For example, flowable silicon oxide can be deposited for STI region $412_I$ using a flowable CVD (FCVD) process. The FCVD process can be followed by a wet anneal process. The wet anneal process can include annealing the deposited layer of insulating material in steam at a temperature in a range from about 200° C. to about 700° C. for a period in a range from about 30 min to about 120 min. The wet anneal process can be followed by the CMP process that can remove the patterned hard mask layer and portions of the layer of the insulating material to substantially co-planarize a top surface of the layer of insulating material with top surfaces of fin structures. The CMP process can be followed by the etching process to etch back the layer of insulating material, the protective layer, and remaining nitride hard mask on the fin structures to form the structure of FIG. 4J.

The etch back of the layer of insulating material can be performed, for example, by a dry etch process, a wet etch process, or a combination thereof. In some embodiments, the dry etch process can include using a plasma dry etch with a gas mixture having octafluorocyclobutane ($C_4F_8$), argon (Ar), oxygen ($O_2$), and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 mTorr to about 5 mTorr. In some embodiments, the wet etch process can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process can include the use ammonia ($NH_3$) and hydrofluoric acid (HF) as etchants and inert gases such as, for example, Ar, xenon (Xe), He, or a combination thereof. In some embodiments, the flow rate of $H_F$ and $NH_3$ used in the wet etch process can each range from about 10 sccm to about 100 sccm (e.g., about 20 sccm, 30 sccm, or 40 sccm). In some embodiments, the wet etch process can be performed at a pressure ranging from about 5 mTorr to about 100 mTorr (e.g., about 20 mTorr, about 30 mTorr, or about 40 mTorr) and a high temperature ranging from about 50° C. to about 120° C.

Referring to FIG. 3, method 300 proceeds to operation 316, in which one or more recessed fin structure are formed. As illustrated in FIGS. 4K and 4L, the formation of the one or more recessed fin structures can include (i) depositing dummy oxide layer 426 on the semiconductor structure of FIG. 4J; (ii) depositing polysilicon $418_K$ over dummy oxide layer 426; and (iii) reducing the height of the fin structures by an etching process (e.g., CMP). In some embodiments, after the etching process, a first plurality of recessed fin structures can include remaining Si $410_L$ having (110) or (100) R45 orientation on top surface. In some embodiments, after the etching process, a second plurality of recessed fin structure 420 can include remaining SiGe having (100) orientation on top surface. In some embodiments, dummy oxide layer can be formed by a variety of processes, including, but not limited to, chemical growth, chemical vapor deposition (CVD), RF sputtering, atomic layer deposition (ALD), low pressure CVD, plasma-enhanced CVD or any other suitable process. In some embodiments, polysilicon can be formed by a variety of processes, including, but not limited to, chemical vapor deposition (CVD), physical vapor deposition (PVD), atomic layer deposition (ALD), other suitable deposition methods, or a combination thereof.

Figure 4M:
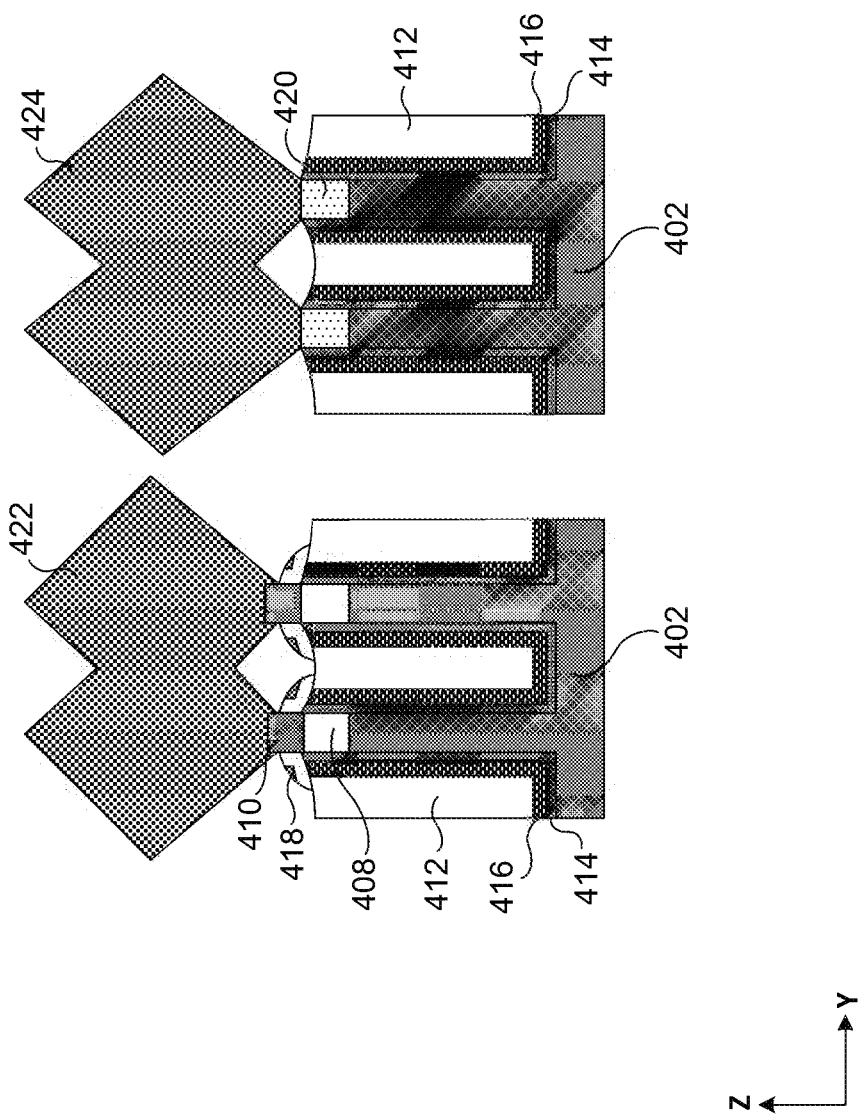

Referring to FIG. 3, method 300 proceeds to operation 318, in which a shallow recess source/drain epitaxy layer is formed on the remaining Si. As illustrated in FIG. 4M, shallow recess source/drain epitaxy structure 410 is formed on the remaining Si $410_L$ (not shown in FIG. 4M but shown in FIG. 4L). In some embodiments, shallow recess source/drain epitaxy structure 410 can be grown by an epitaxial deposition/partial etch process, which can be a cyclic deposition etch process that repeats the epitaxial deposition/partial etch process at least once. In some embodiments, shallow recess source/drain epitaxy structure 410 can be grown by selective epitaxial growth (SEG), where an etching gas is added to promote the selective growth of semiconductor material on the exposed surfaces of remaining Si $410_L$ of the recessed fin structures, but not on insulating material (e.g., dielectric material of STI recess).

In some embodiments, epitaxial source/drains 422 and 424 are formed on shallow recess source/drain epitaxy structure 410 and recessed fin structure 420, respectively. In some embodiments, shallow recess source/drain epitaxy structure 410 can have a thickness between about 3 nm and about 10 nm. In some embodiments, buried oxide layer 408 can have a thickness between about 5 nm and about 15 nm. In some embodiments, recessed fin structure 420 can have a thickness between about 5 nm and about 15 nm. In some embodiments, recessed fin structure 420 can be doped with p-type dopants to form a buried channel region. In some embodiments, the buried channel region can have a thickness between about 5 nm and about 15 nm. In some embodiments, shallow recess source/drain epitaxy structure 410 can be doped with n-type dopants to form a first channel region and recessed fin structure 420 can be doped with p-type dopants to form a second channel region. In some embodiments, the second channel region can be a buried channel region. In some embodiments, thickness of the first channel region can be between about 3 nm and about 10 nm. In some embodiments, thickness of the second channel region can be between about 5 nm and about 15 nm. In some embodiments, thickness of the first channel region is less than the thickness of the second channel region.

In some embodiments, epitaxial source/drains 422 and 424 are formed by growing epitaxial layers over exposed surfaces of shallow recess source/drain epitaxy structure 410 and recessed fin structure 420. Growing the epitaxy layers on exposed surfaces of shallow recess source/drain epitaxy structure 410 and recessed fin structure 420 can include performing a pre-clean process to remove the native oxide on the surface of shallow recess source/drain epitaxy structure 410 and recessed fin structure 420. Next, an epitaxy process can be performed to grow the epitaxy layers on the surfaces of shallow recess source/drain epitaxy structure 410 and recessed fin structure 420. In some embodiments, as shown in FIGS. 4K-4M, fin structures 410$_H$ and 420$_H$ are etched back using a suitable etching process such as, for example, a dry RIE etching process. An epitaxy process can then be performed to grow epitaxy layers from the top surfaces of shallow recess source/drain epitaxy structure 410 and recessed fin structure 420. The epitaxy process can use the top surfaces of shallow recess source/drain epitaxy structure 410 and recessed fin structure 420 as a seed layer and the growth process continues until a nominal size and/or structure of epitaxial source/drains 422 and 424 has been reached. An in-situ doping process can also be performed during the epitaxy process. In some embodiments, the epitaxy process is an SiGe epitaxy process performed at a temperature between about 400° C. and about 500° C. (e.g., between 400° C. and 500° C.). The epitaxy process can be a selective process that grows the epitaxy layer on the exposed surfaces of the fin structures. The growth process can continue until a nominal size and/or structure of epitaxial source/drains 422 and 424 has been reached. In some embodiments, epitaxial source/drains 422 can include Si. In some embodiments, epitaxial source/drains 424 can include SiGe. In some embodiments, the thickness of epitaxial source/drains 422 and 424 is between about 10 nm and about 20 nm. In some embodiments, epitaxial source/drains 422 and 424 are doped with p-type or n-type dopants during the epitaxy process. For example, epitaxial source/drains 422 can be doped with phosphor (P), and epitaxial source/drains 424 can be doped with boron (B) during the epitaxy process.

The epitaxial source/drains 422 and 424 can also take different shapes depending on various factors such as, for example, the epitaxy process condition, the crystalline orientation of fin structures, and/or other suitable factors. In some embodiments, the shape of the epitaxial source/drains 422 and 424 is a diamond-like shape.

In some embodiments, the semiconductor devices disclosed herein can include a first fin structure including a plurality of shallow recess source/drain epitaxy structures 410 and a second fin structure including a plurality of recessed fin structures 420.

In some embodiments, the semiconductor device can include a third fin structure. The third fin structure can include one or more diodes (e.g., N+/p-type well diode or P+/n-type well diode), and/or one or more bipolar junction transistor (e.g., NPN bipolar junction transistor or PNP bipolar junction transistor).

Figure 5:
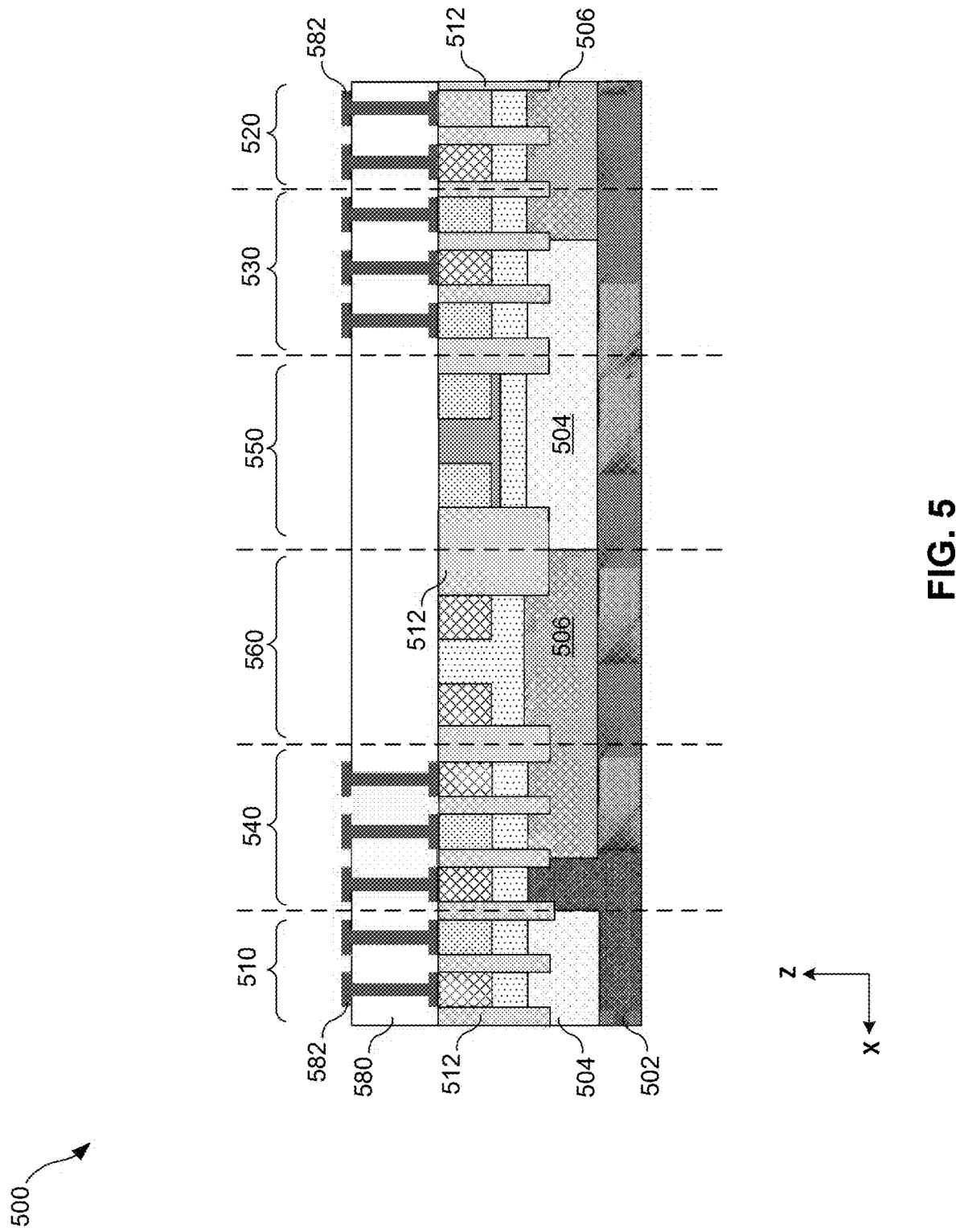
FIG. 5 is a schematic of partially-fabricated semiconductor structures, in accordance with some embodiments.

FIG. 5 is a schematic view of an exemplary partially-fabricated semiconductor structure 500 including a plurality of semiconductor devices. The present disclosure provides a streamlined, simple, and cost effective process to fabricate n-type FinFET devices, p-type FinFET devices, and other suitable semiconductor devices (e.g., bipolar junction transistor structures and diodes) on the same substrate with optimized drive current for the FinFET devices. As illustrated in FIG. 5, semiconductor structure 500 includes a partially-fabricated n-type FinFET device 550 and a partially-fabricated p-type FinFET device 560 formed on substrate 502. Semiconductor structure 500 can also include suitable semiconductor structures, such as N+/p-type well diode 510, an exemplary P+/n-type well diode 520, an exemplary NPN bipolar junction transistor 530, and an exemplary PNP bipolar junction transistor 540. The semiconductor structures formed on substrate 502 are further described in FIGS. 6-8.

In some embodiments, the semiconductor structures formed on substrate 502 can be separated by STI structures 512. Substrate 502 can include various doped regions, such as p-type well 504 and n-type well 506 that are respectively doped with p-type dopants and n-type dopants. Substrate 502 can further include other suitable doped regions and are not illustrated in FIGS. 5-8 for simplicity. A dielectric layer, such as interlayer dielectric layer (ILD) 580, is disposed on the semiconductor structures and a plurality of interconnect structures 582 extends through ILD 580 and are in contact with terminals of various semiconductor devices to provide electrical connections. Examples of interconnect structures can be through silicon vias (TSVs) formed of conductive materials, such as cobalt, copper, tungsten, any suitable conductive material, and/or combinations thereof.

Figure 6:
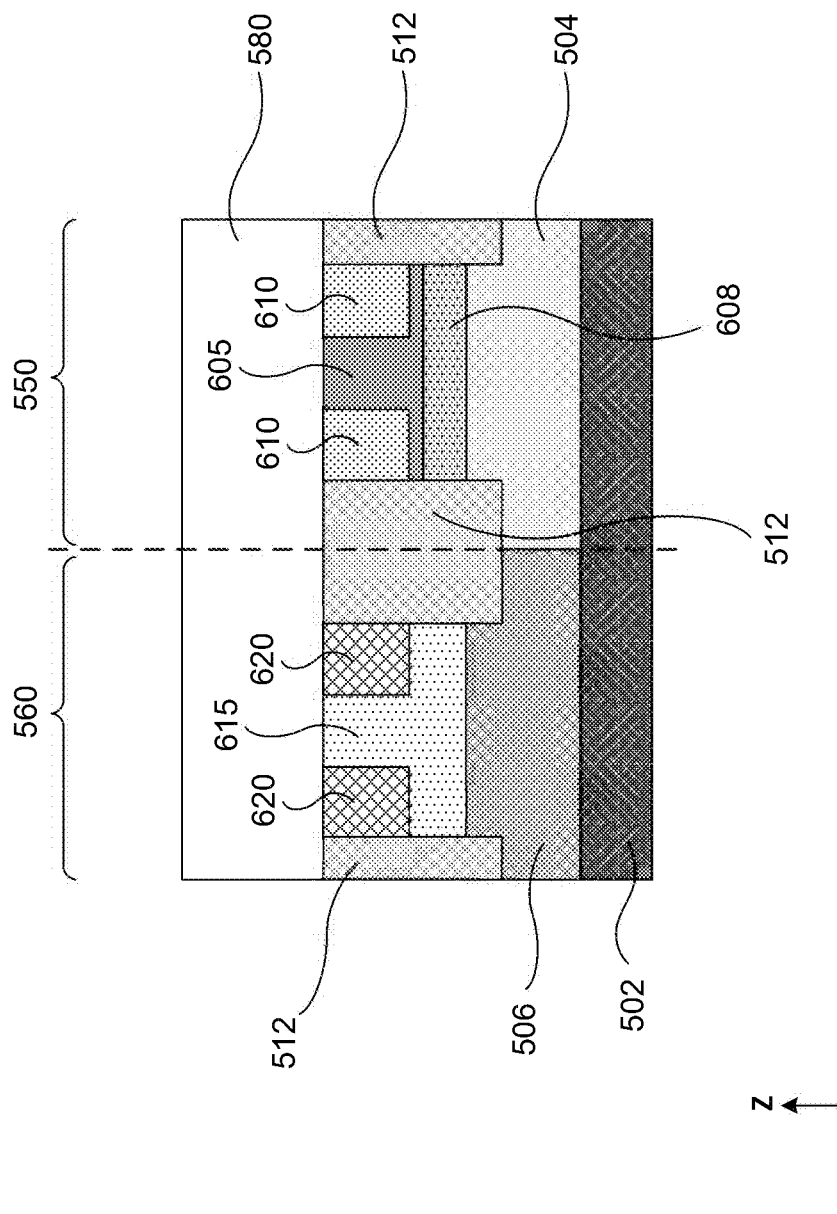
FIG. 6 is a schematic of a partially-fabricated semiconductor structure of n-type FinFETs and p-type FinFETs, in accordance with some embodiments.

FIG. 6 is a schematic view of exemplary partially-fabricated semiconductor structures including a partially-fabricated n-type FinFET device 550, a partially-fabricated p-type FinFET device 560, and interlayer dielectric (ILD) layer 580, in accordance with some embodiments. ILD layer 580 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material is silicon oxide. In some embodiments, ILD layer 580 can have a vertical thickness along a z-axis in a range from about 50 nm to about 200 nm. Based on the disclosure herein, other materials, thicknesses, and formation methods for ILD layer 580 are within the scope this disclosure.

In some embodiments, partially-fabricated n-type FinFET device 550 can include substrate 502, dielectric layer 608, channel region 605, first and second source/drain (S/D) regions 610, and STI regions 512. In some embodiments, dielectric layer 608 is a buried oxide layer of an SOI structure and formed over p-type well 504. In some embodiments, substrate 502 is a p-type substrate. In some embodiments, substrate 502 is Si (100). In some embodiments, first and second source/drain regions 610 have n-type dopants.

In some embodiments, the partially-fabricated p-type FinFET device 560 can include substrate 502, n-type well 506, buried channel region 615, first and second source/drain (S/D) regions 620, and STI regions 512. In some embodiments, buried channel region 615 can be a portion of a fin structure. In some embodiments, buried channel region 615 and source/drain (S/D) regions 620 can include SiGe. In some embodiments, substrate 502 can be a p-type substrate. In some embodiments, substrate 502 is Si (100). In some embodiments, first and second source/drain regions 620 can have p-type dopants. In some embodiments, n-type well 506 can be doped with n-type dopants to a nominal concentration. In some embodiments, n-type well can be formed in the substrate under the fin structures, by doping the substrate using ion implantation.

In some embodiments, n-type FinFET device 550 and p-type FinFET device 560 can be respectively similar to n-type FinFET devices 250 and partially-fabricated p-type FinFET devices 260 described above in FIG. 2. For example, fin structures of n-type FinFET device 550 can include silicon having (110) or (100) rotated 45-degree ((100) R45) crystal orientation. In some embodiments, fin structures of p-type FinFET device 560 can include SiGe having (100) crystal orientation. Similar to selection of crystal orientations for the FinFET devices described in FIG. 2, selectively choosing a dual crystal orientation for the fin structures in FIGS. 5 and 6, electron transport of n-type FinFET device 550 and p-type FinFET device 560 can be optimized.

Figure 7B:
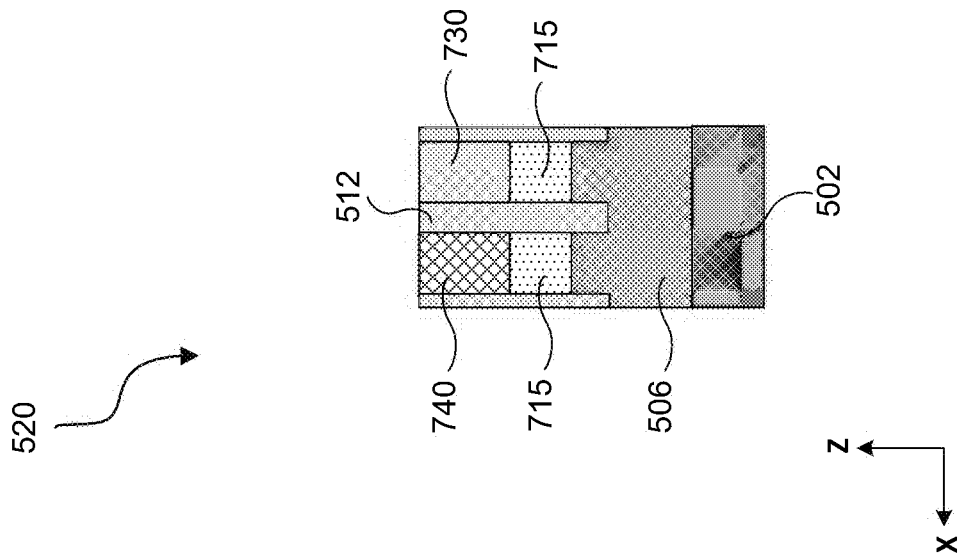
FIGS. 7A and 7B are schematics of an N+/p-type well diode and a P+/n-type well diode, respectively, in accordance with some embodiments.
Figure 7A:
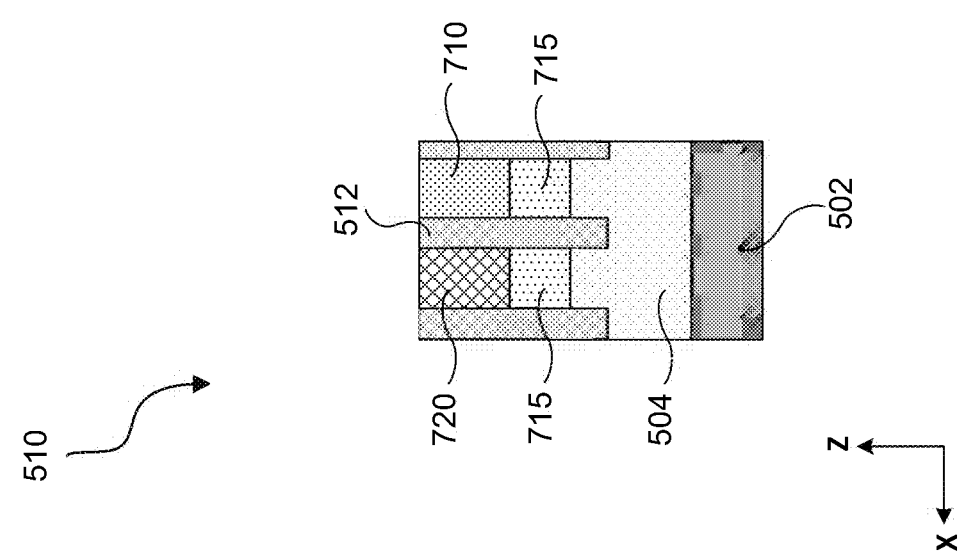

FIGS. 7A and 7B illustrate an exemplary N+/p-type well diode 510 (FIG. 7A) and an exemplary P+/n-type well diode 520 (FIG. 7B) of semiconductor device 500 in FIG. 5, in accordance with some embodiments. The N+/p-type well diode and P+/n-type well diode can include a third fin structure having SiGe. The p-type FinFET described above can also include SiGe in the fin structure. As such, the diode can be integrated with the above disclosed FinFETs to form semiconductor devices. In addition, the diodes illustrated in FIGS. 8A-8B can include n-type and p-type regions formed using epitaxial growth processes similar to those described in FIG. 4M, such that different devices can be formed on the same substrate without using additional fabrication steps.

Referring to FIG. 7A, an N+/p-type well diode 510 can be formed on substrate 502 and include a semiconductor structure 715, p-type region 720, n-type region 710, a p-type well 504 formed in substrate 502 under semiconductor structure 715, and an STI structure 512 between p-type and n-type regions 720 and 710 respectively. In some embodiments, n-type region 710 can include n-type dopants. In some embodiments, p-type region 720 and p-type well 504 can include p-type dopants. In some embodiments, semiconductor structure 715 can be a fin structure formed of SiGe.

Referring to FIG. 8B, a P+/n-type well diode 520 can be formed on substrate 502 and include semiconductor structure 715, p-type region 740, n-type region 730, an n-type well 506 formed in substrate 502 under semiconductor structure 715, and STI structure 512 between p-type and n-type regions 740 and 730 respectively. In some embodiments, n-type region 730 and n-type well 506 can include n-type dopants. In some embodiments, p-type region 740 can include p-type dopants.

In some embodiments, substrate 502 can be a bulk material, such as Si. In some embodiments, bulk SiGe, bulk germanium (Ge), SiGe on insulator, or Ge on insulator can be used as substrate 502. In some embodiments, semiconductor structure 715 can include SiGe. SiGe has several advantageous features. Since SiGe has a smaller band gap and therefore a lower avalanche breakdown field than Si, it is particularly suitable for the gated p-i-n diode employing the avalanche mechanism. With lower avalanche breakdown field, device reliability is improved since hot carrier energy is lowered. Also, devices with SiGe in the doped regions can induce compressive stress on the device channel and further enhance the avalanche mechanism. SiGe can be epitaxially grown in a chamber having pressure of about 1 mTorr to about 100 Torr and grown to a thickness of between about 2 nm and about 100 nm. The resulting Ge content is between about 10% and about 80%. STI structure 512 can be formed by etching shallow trenches in substrate 502 and filling the trenches with an insulator, such as silicon oxide.

FIGS. 8A and 8B illustrate an exemplary NPN bipolar junction transistor 530 (FIG. 8A) and an exemplary PNP bipolar junction transistor 540 (FIG. 8B) of semiconductor device 500 in FIG. 5, in accordance with some embodiments. The bipolar junction transistor can include SiGe in the fin structure. The p-i-n diodes described above can include SiGe in the channel. And the p-type FinFET described above can also include SiGe in the fin structure. As such, the bipolar junction transistor can be integrated with the above disclosed FinFETs and p-i-n diodes to form semiconductor devices.

Referring to FIG. 8A, an NPN bipolar junction transistor 530 can include a substrate 502, a semiconductor structure 715, a first doped region 810, a second doped region 820, a third doped region 830, a p-type well 504 formed within substrate 502 under semiconductor structure 715, an n-type well 506, and an STI structure 512. In some embodiments, first doped region 810 can include an collector region. In some embodiments, second doped region 820 can include a base region. In some embodiments, third doped region 830 can include an emitter region. In some embodiments, first doped region 810 and third doped region 830 can include a first type dopant and second doped region 820 can include a second type dopant opposite to the first type (e.g., the collector/emitter region can have a different type of dopant than that of the base region). In some embodiments, first doped region 810 and third doped region 830 can include n-type dopants as the first type dopant. In some embodiments, second doped region 820 can include p-type dopants as the second type dopant. In some embodiments, semiconductor structure 715 can be a fin structure including SiGe.

Referring to FIG. 8B, a PNP bipolar junction transistor 540 can include substrate 502, semiconductor structure 715 with a first doped region 840, a second doped region 870, a third doped region 880, an n-type well 506 formed within substrate 502, and STI structure 512 formed between doped regions. In some embodiments, first doped region 840 can include an emitter region. In some embodiments, second doped region 870 can include a base region. In some embodiments, third doped region 880 can include a collector region. In some embodiments, first doped region 840 and third doped region 880 can include a first type dopant and second doped region 870 can include a second type dopant opposite to the first type. In some embodiments, first doped region 840 and third doped region 880 can include n-type dopants. In some embodiments, first doped region 840 and third doped region 880 can include p-type dopants. In some embodiments, second doped region 870 can include n-type dopants. In some embodiments, semiconductor structure 715 extends laterally through substrate 502. In some embodiments, semiconductor structure 715 can be a fin structure including SiGe.

Various embodiments in accordance with this disclosure provide a semiconductor device. The semiconductor device can include a substrate, a first fin structure including a first material having a first top surface crystal orientation, and a second fin structure including a second material having a second top surface crystal orientation. The second material can be different from the first material. And the second crystal orientation can be different from the first top surface crystal orientation.

Various embodiments in accordance with this disclosure also provide a semiconductor device. The semiconductor device can include a substrate, a first fin field effect transistor (FinFET), a second FinFET, and a third fin structure, disposed on the substrate. The first FinFET can include a first fin structure with a first material having a first top surface crystal orientation. The second FinFET can include a second fin structure with a second material having a second top surface crystal orientation. The second material can be different from the first material. And the second top surface crystal orientation can be different from the first top surface crystal orientation. The third fin structure can include SiGe.

Various embodiments in accordance with this disclosure also provide a method of fabricating a semiconductor device. The method can include providing a substrate with a device layer; removing a portion of the device layer; forming a SiGe epitaxy layer over a portion of the substrate, where the device layer on the portion of the substrate is removed; and etching the device layer and SiGe epitaxy layer to form a first fin structure including a first material having a first top surface crystal orientation and a second fin structure including a second material having a second top surface crystal orientation. The second material can be different from the first material. And the second crystal orientation can be different from the first top surface crystal orientation.

It is to be appreciated that the Detailed Description section, and not the Abstract of the Disclosure, is intended to be used to interpret the claims. The Abstract of the Disclosure section can set forth one or more but not all exemplary embodiments contemplated and thus, are not intended to be limiting to the subjoined claims.

The foregoing disclosure outlines features of several embodiments so that those skilled in the art can better understand the aspects of the present disclosure. Those skilled in the art will appreciate that they can readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they can make various changes, substitutions, and alterations herein without departing from the spirit and scope of the subjoined claims.

What is claimed is:

1. A method of fabricating a semiconductor device, comprising:
    forming a spacer on sidewalls of a device layer and a dielectric layer;
    forming a silicon germanium (SiGe) epitaxy layer comprising a slanted sidewall and a vertical sidewall, and wherein the vertical sidewall is in contact with the spacer;
    depositing a polysilicon structure on the slanted sidewall and between the device layer and the SiGe epitaxy layer;
    etching the device layer and the dielectric layer to form a first fin structure comprising a portion of the device layer with a first top surface crystal orientation;
    removing the polysilicon structure; and
    etching the SiGe epitaxy layer to form a second fin structure comprising a portion of the SiGe epitaxy layer, wherein the second fin structure comprises a second top surface crystal orientation different from the first top surface crystal orientation.

2. The method of claim 1, wherein forming the SiGe epitaxy layer comprises depositing a SiGe material and etching the SiGe material.

3. The method of claim 1, further comprising depositing a silicon nitride layer on the polysilicon structure.

4. The method of claim 3, further comprising depositing an other polysilicon structure on the silicon nitride layer.

5. The method of claim 4, further comprising performing a planarization process on the other polysilicon structure until the silicon nitride layer is exposed.

6. The method of claim 3, further comprising removing the silicon nitride layer prior to removing the polysilicon structure.

7. The method of claim 1, further comprising removing a portion of the spacer to form an opening between the vertical sidewall and the device layer.

8. The method of claim 7, wherein depositing the polysilicon structure comprises depositing a polysilicon material in the opening.

9. The method of claim 1, further comprising:
    depositing an oxide layer on top surfaces of the device layer and the SiGe epitaxy layer; and
    patterning the oxide layer.

10. The method of claim 9, further comprising depositing and patterning a hard mask layer on the oxide layer.

11. A method for forming a semiconductor device, comprising:
    depositing a device layer and a dielectric layer;
    forming a silicon germanium (SiGe) epitaxy layer comprising a slanted sidewall and a vertical sidewall;
    depositing a polysilicon structure in contact with the slanted sidewall, the vertical sidewall, and a sidewall of the device layer;
    etching the device layer and the dielectric layer to form a first fin structure comprising a portion of the device layer with a first top surface crystal orientation; and
    etching the SiGe epitaxy layer to form a second fin structure comprising a portion of the SiGe epitaxy layer, wherein the second fin structure comprises a second top surface crystal orientation different from the first top surface crystal orientation.

12. The method of claim 11, further comprising forming a spacer on the sidewall of the device layer.

13. The method of claim 12, further comprising removing a portion of the spacer to form an opening between the vertical sidewall and the sidewall of the device layer.

14. The method of claim 13, wherein depositing the polysilicon structure comprises depositing a polysilicon material in the opening.

15. The method of claim 11, further comprising:
    depositing an oxide layer on top surfaces of the device layer and the SiGe epitaxy layer; and
    patterning the oxide layer.

16. A method for forming a semiconductor device, comprising:
    depositing a device layer and a dielectric layer on a substrate;
    forming a spacer on sidewalls of the device layer and the dielectric layer;
    forming a silicon germanium (SiGe) epitaxy layer on the substrate;
    etching the spacer to form an opening between a sidewall of the SiGe epitaxy layer and the sidewall of the device layer;

depositing a polysilicon structure in the opening and in contact with the etched back spacer and the sidewalls of the device layer and the SiGe epitaxy layer;

etching the device layer and the dielectric layer to form a first fin structure comprising a portion of the device layer with a first top surface crystal orientation; and etching the SiGe epitaxy layer to form a second fin structure comprising a portion of the SiGe epitaxy layer, wherein the second fin structure comprises a second top surface crystal orientation different from the first top surface crystal orientation.

17. The method of claim 16, wherein forming the SiGe epitaxy layer comprises:

depositing a SiGe material; and etching the SiGe material to form a slanted sidewall.

18. The method of claim 17, wherein depositing the polysilicon structure comprises depositing a polysilicon material on the slanted sidewall.

19. The method of claim 18, further comprising depositing a silicon nitride layer on the polysilicon material.

20. The method of claim 19, further comprising:

depositing an other polysilicon structure on the silicon nitride layer; and performing a planarization process on the other polysilicon structure until the silicon nitride layer is exposed.

* * * * *